United States Patent [19]

Barker, III et al.

[11] Patent Number: 5,175,613

[45] Date of Patent: Dec. 29, 1992

[54] PACKAGE FOR EMI, ESD, THERMAL, AND MECHANICAL SHOCK PROTECTION OF CIRCUIT CHIPS

[75] Inventors: Charles R. Barker, III, Harvard; Richard J. Casabona, Stow; David M. Fenwick, Chelmsford, all of Mass.

[73] Assignee: Digital Equipment Corporation, Maynard, Mass.

[21] Appl. No.: 644,401

[22] Filed: Jan. 18, 1991

[51] Int. Cl.[5] ............................. H01L 25/04
[52] U.S. Cl. ........................ 257/713; 361/386; 361/424; 174/35 R; 174/35 GC; 257/659; 257/717
[58] Field of Search ............... 357/74, 81, 72, 84, 357/53; 361/386, 387, 424; 174/35 R, 50.59, 35 GC

[56] References Cited

U.S. PATENT DOCUMENTS

| | | | |
|---|---|---|---|
| 4,217,684 | 8/1980 | Brisken et al. | 357/80 |
| 4,233,645 | 11/1980 | Balderes et al. | 361/386 |
| 4,251,852 | 2/1981 | Ecker et al. | 361/386 |
| 4,442,450 | 4/1984 | Lipschutz et al. | 357/81 |
| 4,514,752 | 4/1985 | Engel et al. | 361/74 |
| 4,561,011 | 12/1985 | Kohara et al. | 357/81 |
| 4,599,680 | 7/1986 | Gibson et al. | 357/81 |
| 4,612,601 | 9/1986 | Watari | 357/81 |
| 4,680,617 | 7/1987 | Ross | 357/74 |
| 4,680,676 | 7/1987 | Petratos et al. | 361/424 |
| 4,715,115 | 12/1987 | King et al. | 361/387 |
| 4,736,266 | 4/1988 | Tanibe | 361/424 |
| 4,754,101 | 6/1988 | Stickney et al. | 361/424 |
| 4,812,949 | 3/1989 | Fantan et al. | 361/386 |
| 4,829,432 | 5/1989 | Hershberger et al. | 361/424 |
| 5,043,534 | 8/1991 | Mahulikar et al. | 357/84 |

FOREIGN PATENT DOCUMENTS

| | | | |
|---|---|---|---|
| 421343A | 4/1991 | European Pat. Off. | 357/84 |
| 0127557 | 5/1988 | Japan | 357/74 |
| 63-308943 | 12/1988 | Japan | 357/81 |
| 1-30297 | 2/1989 | Japan | 361/424 |
| 2-143498 | 6/1990 | Japan | 174/35 R |
| 2-237053 | 9/1990 | Japan | 357/84 |

OTHER PUBLICATIONS

"Copper/Polyester Laminate as an EMI/ESD Shield", IBM Technical Disclosure Bulletin, vol. 28, No. 10, Mar. 1986.

IBM T.D.B., vol. 24, No. 11A, p. 5743, Chu, R. C. et al., Silicon Heat Sink for Semiconductor Chip, Apr. 1982.

IBM T.D.B., vol. 24, No. 11A, pp. 5595-5597, Hassan, J. K. et al., Chip Cooling Employing a Conformable Alloy (Apr. 1982).

Primary Examiner—Rolf Hille
Assistant Examiner—Minhloan Tran
Attorney, Agent, or Firm—Clayton L. Satow; Barry N. Young; Ronald E. Myrick

[57] ABSTRACT

A package for integrated circuit chips, or other electrical devices, provides mechanical shock and thermal protection for the chips, and in addition, protects the chips from electromagnetic interference and electrostatic discharge. The package includes a printed wiring board base for reception of one or more circuit chips, and a conductive heat sink and cover. The conductive heat sink, in conjunction with a reference plane in the wiring board base, acts as an EMI shield for the chips. The heat sink is covered with an insulating layer, on top of which, a conductive coating is placed. The conductive coating is electrically connected to the reference plane, and the two act to protect the chips from electrostatic discharges. Compliant pads support the chips, and a thermally conductive elastomer can be placed on top of each chip between the chips and the inner top surface of the heat sink. The chips are thereby held securely in position, and are thermally connected to the heat sink.

23 Claims, 2 Drawing Sheets

PACKAGE FOR EMI, ESD, THERMAL, AND MECHANICAL SHOCK PROTECTION OF CIRCUIT CHIPS

BACKGROUND OF INVENTION

The present invention relates, in general, to a package for circuit chips which provides integral protection of the chips from electromagnetic interference (EMI), electrostatic discharge (ESD), temperature extremes, and, mechanical shock. The package also shields the environment from EMI emissions from the chips.

Modern integrated circuit technology, such as CMOS and ECL, utilize integrated circuit packages that include ICs with high lead count, relatively fragile interconnects, high power dissipation, and fast switching speeds. In order to operate properly and reliably, these circuits must be protected from extreme operating temperatures, mechanical shock, electromagnetic interference, and electrostatic discharge. Also, the FCC imposes requirements with respect to EMI emissions from devices such as these, and shielding must therefore be provided to protect the environment from these emissions.

In the past, various attempts have been made to provide solutions to each of the above issues individually, but not in combination with one another. For example, heat sinks have long been used for electronics packaging to maintain the temperature of the electronics within their operating range. However, these do not provide shock, EMI, or ESD protection. Similarly, module shielding techniques, such as can found in a TV, VCR, or video decoder, for example, employ a metal "can" that is formed around a series of components, and is connected to provide EMI shielding for the components, but no thermal or mechanical shock protection for the same.

SUMMARY OF THE INVENTION

It is therefore the object of the present invention to provide an integral package for integrated circuits which will protect the circuits from extreme temperatures, mechanical shock, EMI, and, ESD, and also, shield the environment from EMI emissions from the circuits.

This, and other objects of the invention, are attained through provision of a circuit package structure which includes a printed wiring board base for reception of one or more circuit chips, and a five sided box type cover and heat sink having integral heat radiating fins formed in the top thereof. To provide mechanical shock protection for the circuit chips, compliant stand off supports are employed between the chips and the base to support the chips on the base. A thermally conductive elastomer, or other spring material, can then be placed on top of each circuit chip so that when the heat sink cover is secured to the base, the inner top surface of the cover will contact the elastomer, and compress both the elastomer on the top of each chip, as well as the compliant supports below each chip. As a result, each chip is held securely and is protected from mechanical shocks to which the package is subjected. Also, the thermally conductive elastomer provides an excellent thermal path between each of the chips, and the heat sink, to thereby insure adequate control of the chip operating temperatures.

To provide an EMI shield between each chip and the environment, the heat sink is made of a conductive material, such as aluminum, and is electrically connected to a reference plane in the printed wiring board base. Each chip is thus surrounded by the conductive shield formed by the heat sink, and the reference plane.

For ESD protection, an additional conductive coating is necessary. This is provided by applying an insulating material to the outside surface of the heat sink, and then applying an additional conductive coating on top of the layer of insulating material. This conductive coating is electrically connected to the heat sink, and to the wiring board reference plane by a conductive gasket, or contact, that is disposed in the heat sink/base interface when the package is assembled.

BRIEF DESCRIPTION OF THE DRAWINGS

The foregoing and additional objects, features, and advantages, of the invention will become apparent from the following detailed description thereof, taken in conjunction with the accompanying drawings, in which.

DETAILED DESCRIPTION OF THE PREFERRED EMBODIMENT

Figure 1:
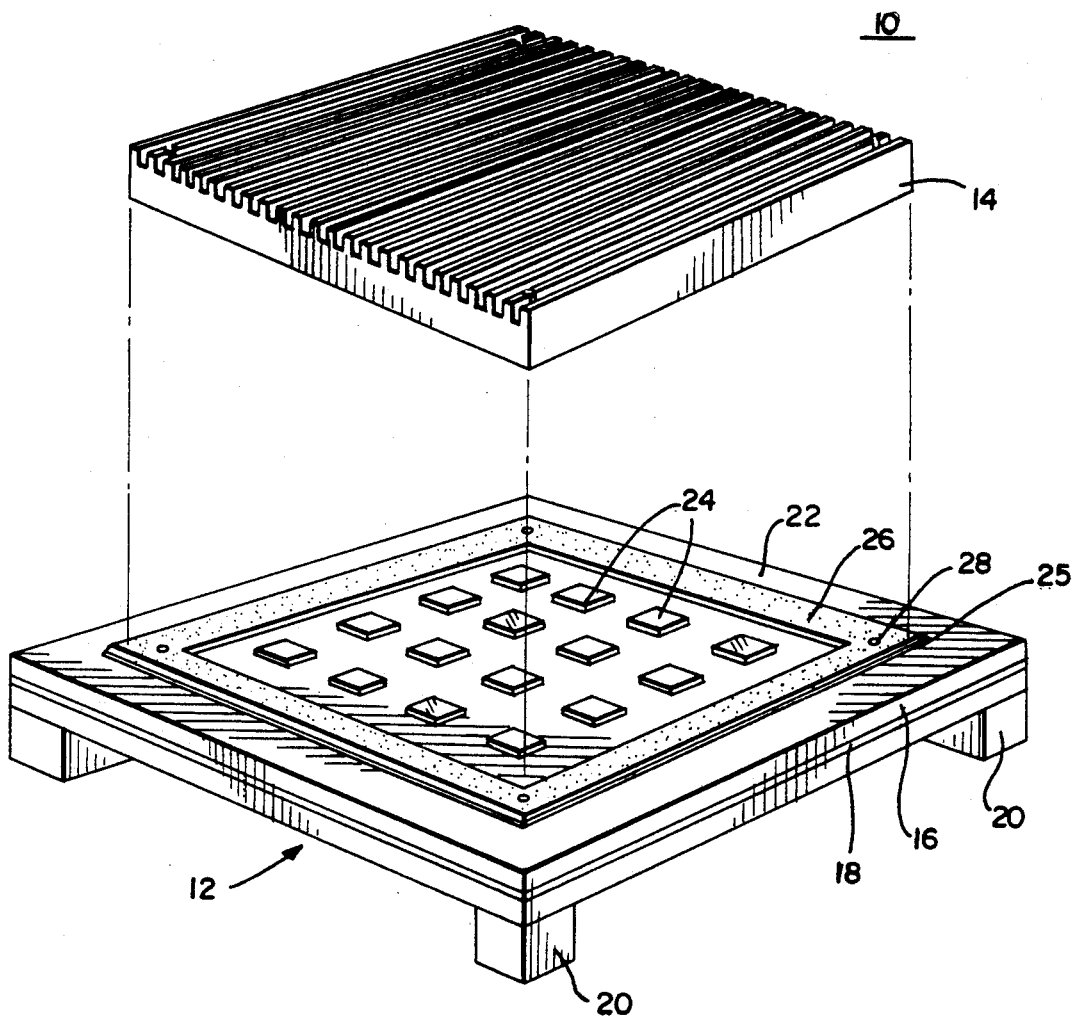
FIG. 1 is a diagrammatic perspective view of a circuit package constructed in accordance with the present invention showing a combination heat sink and cover removed; and, FIG. 2 is a partial cross sectional view showing the details of the circuit package.

Turning now to a more detailed consideration of the invention, there is illustrated in FIG. 1, an integrated circuit package 10, which includes a base 12, and a combination heat sink and cover 14.

Base 12 is preferably formed from a printed wiring board 16, which is a layered substrate having a conductive layer 18 disposed in the middle thereof that forms a "reference plane". A plurality of support pads or blocks 20 can be disposed beneath the four corners of board 16, if desired.

Disposed on a top surface 22 of board 16, are one or more integrated circuit chips, or other electrical devices, 24. It will be understood that package 10 can be sized to accommodate any number or size of chips or devices. Further details of the chip mountings are illustrated in FIG. 2, and it will be understood that each of the chips includes a plurality of conductor leads (not shown) for electrically connecting them to circuitry in printed wiring board 16.

Also disposed on top surface 22, and generally around its periphery, is a narrow rectangular frame shaped conductive metal strip 25, on top of which is disposed, a similar shaped strip of conductive material 26, which surrounds the mounting area for chips 24. Conductive material 26 is preferably compliant, and can be a spring metal, or conductive elastomer, for example. This acts as an electrical gasket for the interface between heat sink 14 and base 12, and will be discussed in further detail below. A plurality of apertures 28 are disposed in compliant strip 26 at its corners that also pass through board 16 to receive mounting screws or bolts for attaching heat sink 14 to base 12

Figure 2:
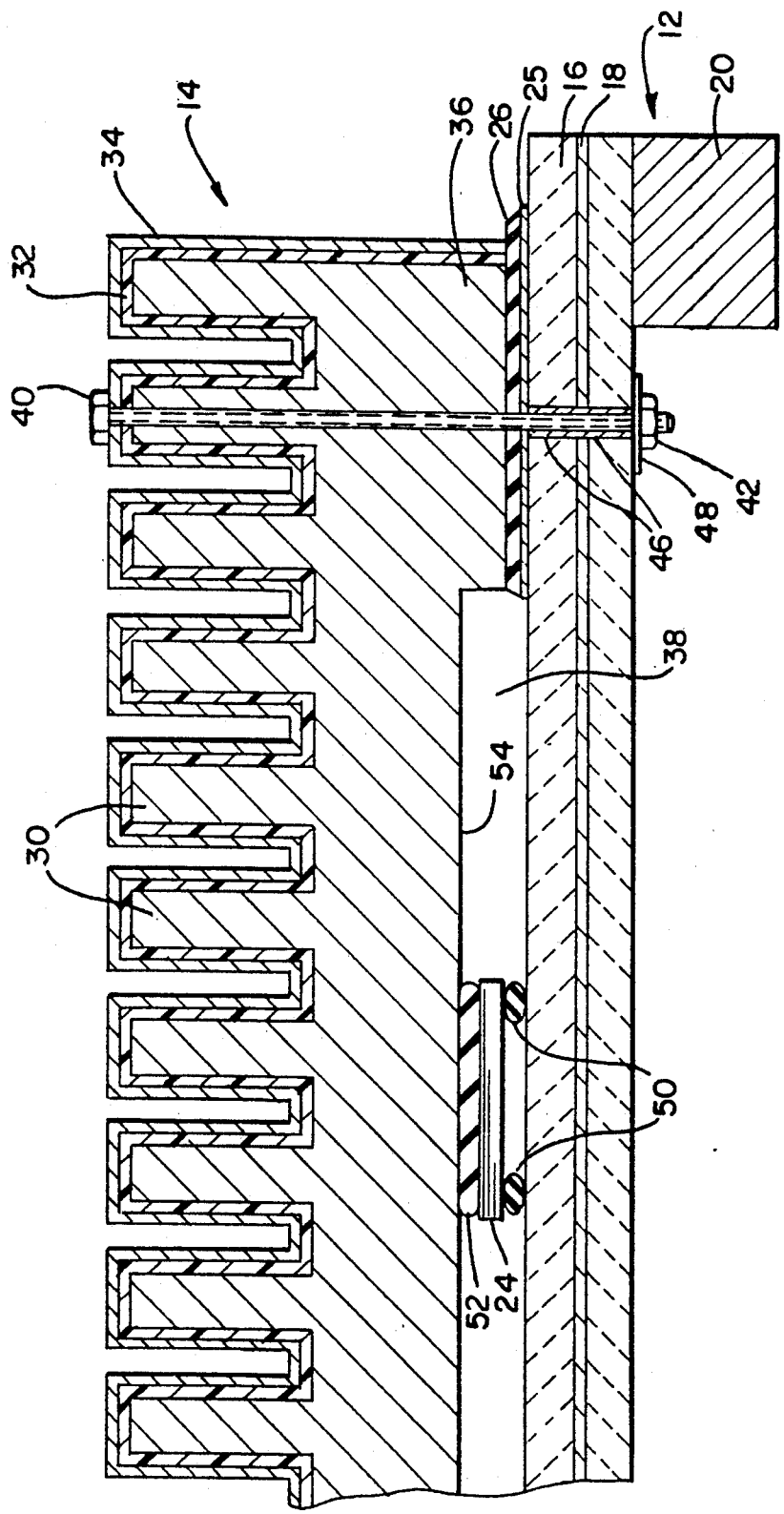

Turning now to FIG. 2, package 10 is shown in greater detail. As illustrated, heat sink 14, which is constructed of a conductive material such as aluminum, preferably includes a plurality of heat radiating fins 30. It should be understood that other types of radiating elements could be formed on heat sink 14 if desired, or if liquid cooling is employed, no heating radiating elements at all are necessary. Disposed on all exterior surfaces of heat sink 14, including fins 30, is a first layer or coating 32 of electrical insulating material. A second layer or coating 34 is placed over insulating layer 32, and is formed from any suitable type of conductive material. Conductive layer 34 provides a surface separate from heat sink 14 for the accumulation of static charge, and thereby provides protection of chips 24 from electrostatic discharges.

When heat sink 14 is assembled to base 12, an integral depending peripheral rim or flange 36 of heat sink 14 engages compliant conductive strip 26, and forms a sealed area 38 for chips 24. A plurality (one shown) of bolts or screws 40, and corresponding nuts 42 are employed for securing heat sink 14 to base 12.

Conductive metal strip 25 is formed integrally with a plurality of conductive vias 46 that pass through apertures 28 in base 12. Vias 46 electrically contact reference plane conductive layer 18, and further extend to the bottom surface of wiring board 16, where small conductive areas 48 are formed for electrically contacting nuts 42.

Compliant conductive layer 26 and metal strip 25 serve to electrically connect heat sink 14, conductive coating 34, and reference plane 18 to thereby provide an enclosure for chips 24, which is shielded both from electromagnetic interference, and from electrostatic discharge. Conversely, the exterior environment is shielded from EMI emissions from the chips 24. In addition, the compliant nature of layer 26, helps insure that chip area 38 will be sealed from external dirt, moisture, etc.

Chips 24 are preferably supported on wiring board 16 by a plurality of compliant pads or cushions 50 which are placed on top surface 22 beneath each of the chips. A thermally conductive compliant cushion 52 is preferably disposed on top of each chip 24, and engages an inner top surface 54 of heat sink 14 when the same is secured to base 12. Cushion 52 not only insures that good thermal contact will be made between chips 24 and heat sink 14, but also insures, in conjunction with support pads 50, that chips 24 will be held securely in position, and insulated from mechanical shock. Alternatively, cushion 52 can be eliminated if desired, and the heat sink dimensions adjusted so that inner top surface 54 will directly contact chips 24 when heat sink 14 is in position.

From the foregoing, it may be thus seen that package 10 is constructed in a simple and compact manner, and provides excellent mechanical, thermal, and electrical protection for chips 24. Heat sink 14 acts to draw heat away from the chips, to hold the chips securely but compliantly in position, and to provide a sealed enclosure for the chips as well. In addition, because it is made of electrically conductive material, heat sink 14, in conjunction with reference plane conductive layer 18, also acts as an EMI shield for chips 24, and in conjunction with conductive coating 34, acts as an ESD shield for chips 24.

Although the invention has been disclosed in terms of a preferred embodiment it will be understood that numerous variations and modifications could be made thereto without departing from the true spirit and scope thereof as defined in the following claims.

What is claimed is:

1. A package for an electrical device comprising:
   a) a base member having an electrically conductive layer,
   b) an electrically conductive cover member disposed on said base member and electrically connected to said electrically conductive layer;
   said base and cover member forming an electromagnetic interference shielded enclosure;
   an electrical device disposed within said interference shielded enclosure;
   means on said enclosure to direct heat away from said electrical device;
   means in said shielded enclosure to compliantly and securely hold said electrical device in position within said shielded enclosure between said base and cover member to protect said electrical device from mechanical shock; and,
   means on said enclosure to shield said electrical device from electrostatic discharge.

2. The package of claim 1, further comprising means for sealing said shielded enclosure.

3. The package of claim 1, wherein said means on said enclosure to direct heat away from said electrical device comprises heat radiating means formed on said cover member and means to connect thermally said cover member to said electrical device.

4. The package of claim 3, wherein said means to connect thermally said cover member to said electrical device comprises a thermally conductive material disposed between said cover member and said electrical device.

5. The package of claim 1, wherein said means to compliantly and securely hold said electrical device comprises at least a first compliant pad means disposed between said base member and said electrical device.

6. The package of claim 5 further including at least a second compliant pad means disposed between an inner top surface of said cover member and said electrical device.

7. The package of claim 6, wherein said second compliant pad means is formed from thermally conductive material.

8. A package for an electrical device, comprising
   a base member having an electrically conductive layer;
   an electrically conductive cover member disposed on said base member and electrically connected to said electrically conductive layer,
   said base and cover member forming an electromagnetic interference shielded enclosure;
   an electrical device disposed within said interference shielded enclosure;
   means on said enclosure to direct heat away from said electrical device;
   means in said shielded enclosure to compliantly and securely hold said electrical device in position within said shielded enclosure between said base and cover members to protect said electrical device from mechanical shock; and,
   means on said enclosure to shield said electrical device from electrostatic discharge wherein said means on said enclosure to shield said electrical device from electrostatic discharge comprises:
   an electrically insulating layer of material disposed on and completely covering an exterior surface of said conductive cover member; and,
   a layer of electrically conductive material disposed on said insulating layer, said electrically connected to said electrically conductive layer in said base member.

9. A package for an electrical device, such as an integrated circuit chip comprising:
   a) a base member having a conductive layer disposed therein;
   b) an electrically conductive heat sink cover member mechanically attached to said base member said electrically connected to said conductive layer in said base member;
   said base and cover member forming an electromagnetic interference shielded enclosure;
   c) an electrical device disposed within said interference shielded enclosure;
   d) compliant means disposed between said base member and said electrical device to support said electrical device in a mechanical shock protected member;
   e) means to connect thermally said heat sink cover member to said electrical device to protect said electrical device from elevated temperatures; and,
   f) an electrically insulating layer of material disposed on and completely covering an exterior surface of said heat sink cover member, and a layer of conductive material disposed on said insulating layer and electrically connected to said conductive layer in said base member to provide protection of said electrical device from electrostatic discharge.

10. A package for an integrated circuit chip, comprising:
   a base member having a first electrically conductive layer, wherein said integrated circuit chip is disposed on said base member;
   an electrically conductive cover member disposed on and electrically connected to said first electrically conductive layer, thereby forming an electromagnetic interference shielded enclosure for said integrated circuit chip;
   an electrically insulating layer of material disposed on and completely covering an exterior surface of said cover member; and
   a second electrically conductive layer of material disposed on said electrically insulating layer, said second electrically conductive layer for accumulating static charge, said electrically insulating layer for protecting said integrated circuit chip from static discharge, said second electrically conductive layer electrically connected to said first electrically conductive layer in said base member to provide a path for the discharge of said static charge.

11. A package for an integrated circuit chip as in claim 10, wherein said electrically conductive cover member is a heat sink.

12. A package for an integrated circuit chip as in claim 11, wherein said base member is generally planar and said first electrically conductive layer is a plane generally parallel with the plane of said base member, said disposed within said base member.

13. A package for an integrated circuit chip as in claim 12, further comprising compliant means between said base member and said integrated chip for supporting said integrated circuit chip and protecting said integrated chip from mechanical shock.

14. A package for an integrated circuit chip as in claim 13, wherein said cover member is mechanically attached to said base member.

15. A package for an integrated circuit chip as in claim 14, wherein said second electrically conductive layer includes means for directing heat away from said integrated circuit chip.

16. A package for an integrated circuit chip as in claim 15, further comprising means between said cover member and said integrated circuit chip to compliantly and securely hold said integrated circuit chip.

17. A package for an integrated circuit chip as in claim 10, wherein said base member is generally planar and said first electrically conductive layer is a plane generally parallel with the plane of said base member, and disposed within said base member.

18. A package for an integrated circuit chip as in claim 10, further comprising compliant means between said base member and said integrated circuit chip for supporting said integrated circuit chip.

19. A package for an integrated circuit chip as in claim 10, wherein said cover member is mechanically attached to said base member.

20. A package for an integrated circuit chip as in claim 10, wherein said second electrically conductive layer includes means for directing heat away from said integrated circuit chip.

21. A package for an integrated circuit chip as in claim 10, further comprising means between said cover member and said integrated circuit chip to compliantly and securely hold said integrated circuit chip.

22. A package for an integrated circuit chip, comprising:
   a generally planar base member having a first electrically conductive layer, wherein said integrated circuit chip is disposed on said base member;
   an electrically conductive heat sink cover member disposed on and electrically and mechanically connected to said first electrically conductive layer, thereby forming an enclosure for said integrated circuit chip;
   means in said enclosure to compliantly and securely hold said integrated circuit chip;
   an electrically insulating layer of material disposed on and compliantly covering said cover member for protecting said integrated circuit chip from electrostatic discharge;
   a second electrically conductive layer of material disposed on said electrically insulating layer for providing a surface on which electrostatic charge can accumulate; and
   means for electrically coupling said second electrically conductive layer and said first electrically conductive layer in said base member.

23. A package for a plurality of integrated circuit chips, comprising:
   a generally planar base member having a first electrically conductive layer, wherein said integrated circuit chips are disposed on said base member;
   an electrically conductive heat sink cover member disposed on, said electrically and mechanically connected to said first electrically conductive layer, thereby forming an enclosure for said integrated circuit chips;
   means in said enclosure to compliantly and securely hold said integrated circuit chips; and
   an electrically insulating layer of material disposed on and completely covering said cover member to protect said integrated circuit chips from electrostatic discharge, and
   a second electrically conductive layer of material disposed on said electrically insulating layer, and electrically connected to said first electrically conductive layer in said base member to provide an electrically conductive path for discharging the electrostatic charge.

* * * * *